United States Patent
Kalamatianos et al.

(10) Patent No.: US 9,189,326 B2
(45) Date of Patent: Nov. 17, 2015

(54) DETECTING AND CORRECTING HARD ERRORS IN A MEMORY ARRAY

(71) Applicant: Advanced Micro Devices, Inc., Sunnyvale, CA (US)

(72) Inventors: John Kalamatianos, Arlington, MA (US); Johnsy Kanjirapallil John, Acton, MA (US); Robert Gelinas, Needham, MA (US); Vilas K. Sridharan, Brookline, MA (US); Phillip E. Nevius, Arlington, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 77 days.

(21) Appl. No.: 14/048,830

(22) Filed: Oct. 8, 2013

(65) Prior Publication Data
US 2015/0100848 A1 Apr. 9, 2015

(51) Int. Cl.
| G06F 11/10 | (2006.01) |
| G11C 29/52 | (2006.01) |
| G11C 29/42 | (2006.01) |
| G11C 11/41 | (2006.01) |
| G11C 29/04 | (2006.01) |

(52) U.S. Cl.
CPC ............ *G06F 11/1008* (2013.01); *G11C 29/42* (2013.01); *G11C 29/52* (2013.01); *G11C 11/41* (2013.01); *G11C 2029/0409* (2013.01)

(58) Field of Classification Search
CPC .................................................. G06F 11/1076
USPC .................. 714/763, 752, 773, 710, 766, 764
See application file for complete search history.

(56) References Cited

U.S. PATENT DOCUMENTS

| 4,875,212 A | * | 10/1989 | Hashimoto | .................... 714/764 |
| 5,745,508 A | * | 4/1998 | Prohofsky | ....................... 714/766 |
| 2003/0156453 A1 | * | 8/2003 | Pochmuller | .............. 365/185.09 |

OTHER PUBLICATIONS

Jaume Abella et al., "Low Vccmin Fault-Tolerant Cache with Highly Predictable Performance", Intel Barcelona Research Center, Intel Labs Barcelona—UPC (Spain), Dec. 12, 2009, 11 pages.
Amin Ansari et al., "ZerehCache: Armoring Cache Architectures in High Defect Density Technologies", Advanced Computer Architecture Laboratory, University of Michigan, Ann Arbor, MI, Dec. 12, 2009, 11 pages.
Fred A. Bower et al., "Tolerating Hard Faults in Microprocessor Array Structures", International Conference on Dependable Systems and Networks (DSN) Florence, Italy, Jun. 28, 2004, 10 pages.
C.L. Chen et al., "Error-Correcting Codes for Semiconductor Memory Applications: A State-of-the-Art Review", IBM 1-Res. Develop. vol. 28 Mar. 1, 1984.
Stanley E. Schuster, "Multiple Word/Bit Line Redundancy for Semiconductor Memories", IEEE Journal of Solid State Circuits, vol. SC-13, No. 5, Oct. 1, 1978, 6 pages.
Chris Wilkerson et al., "Trading off Cache Capacity for Reliability to Enable Low Voltage Operation", Microprocessor Technology Lab, Intel Corporation, Sep. 1, 2009, 12 pages.
U.S. Appl. No. 13/926,155, filed Jun. 25, 2013, entitled "Spare Memory External to Protected Memory".

* cited by examiner

*Primary Examiner* — Fritz Alphonse

(57) ABSTRACT

Hard errors in the memory array can be detected and corrected in real-time using reusable entries in an error status buffer. Data may be rewritten to a portion of a memory array and a register in response to a first error in data read from the portion of the memory array. The rewritten data may then be written from the register to an entry of an error status buffer in response to the rewritten data read from the register differing from the rewritten data read from the portion of the memory array.

20 Claims, 10 Drawing Sheets

DETECTING AND CORRECTING HARD ERRORS IN A MEMORY ARRAY

GOVERNMENT LICENSE RIGHTS

This invention was made with government support under Prime Contract Number DE-AC52-07NA27344, Subcontract Number B600716 awarded by the Department of Energy (DOE). The Government has certain rights in this invention.

BACKGROUND

1. Field of the Disclosure

The present disclosure relates generally to integrated circuits and, more particularly, to memory arrays in integrated circuits.

2. Description of the Related Art

In most static random access memory (SRAM) architectures, all of the SRAM cells corresponding to a selected row are written or read out together. Some specific SRAM implementations may selectively write to and read from a subset of the cells in the selected row. Errors occur when values of bits read from one or more of the SRAM cells do not correspond to the values that were intended to be stored in the SRAM cells. For example, an error occurs when a value of "1" is written to an SRAM cell, but a value of "0" is returned when the SRAM cell is subsequently read. This type of error is referred to as a "stuck-at-0" error if the error persists for an extended period. For another example, an error occurs when a value of "0" is written to an SRAM cell, but a value of "1" is returned when the SRAM cell is read. This type of error is referred to as a "stuck-at-1" error if the error persists for an extended period of time.

The errors may be characterized as soft errors or hard errors. Soft errors are intermittent errors that can be corrected by re-writing the faulty SRAM cell. Hard errors persist even after the faulty SRAM cell has been re-written. Hard errors therefore also are referred to as persistent errors or permanent errors. SRAM arrays are susceptible to hard errors that are produced during manufacturing or arise during the life cycle of the product. Some of the hard errors produced during manufacturing may be detected during a memory built-in self-test (MBIST) but other manufacturing errors, as well as errors that arise during the lifecycle of the product, may only be manifested at run time. To illustrate, if an SRAM implemented on a system-on-a-chip (SOC) is operated below its minimum voltage for reliable operation, or if random or environmental conditions affect the state of the SRAM cell, some of the cells in the SRAM may stop functioning correctly and may therefore produce errors even after the faulty SRAM cells have been re-written. The error may persist for an extended period of time. Hard errors of this sort can only be detected at runtime because they depend on the particular environmental conditions present when the SRAM array is being read or written.

Hard or soft errors can be detected using parity bits or error correction code (ECCs) that are stored when information such as a word (e.g., four bytes of data) or a group of bits is written to the SRAM array. For example, a parity bit may be stored along with the data bits in the SRAM array or stored somewhere outside the array in association with the SRAM array. The value of the parity bit may be compared to a parity value computed using a word read from a corresponding SRAM array. The same type of parity (either odd or even parity) is used for both the storage and parity generation logic based on the read out data bits. An error is detected when the stored parity value read out from the array does not match the parity value computed based on the read out data bits from the SRAM cells. Other techniques for detecting errors in the SRAM array include scrubbing and duplicating the SRAM array for comparison to the original SRAM array on each access.

Data may be re-written to the faulty SRAM cells in response to detecting an error, which may correct soft errors. However, hard errors cannot be corrected by re-writing the faulty SRAM cells. Instead, conventional techniques for detecting and correcting soft errors in SRAM cells may cause the processing device to continuously re-write the faulty SRAM cells without ever correcting the hard error and may even deleteriously affect the functionality of the processing device. To recover from a hard error, the processing device using the SRAM must be flushed and restarted after the faulty SRAM cells have been replaced. For example, if a memory built-in self-test (MBIST) detects a hard error in an SRAM, the row or column that includes the faulty SRAM cell may be replaced using redundant rows or columns. For another example, sub-blocks of SRAM cells that include the faulty SRAM cells may be replaced by mapping the indices of the faulty sub-blocks to spare sub-blocks in the SRAM.

Conventional approaches to error detection and correction in SRAM arrays have a number of drawbacks, particularly when implemented in high-performance computing systems that may need to run continuously for long periods of time without interruption. For example, scientific computing projects such as DNA sequencing or climate studies may require continuously operating a processing device for months at a time or even longer. Flushing the state of the processing device to physically replace or repair the SRAM in response to detecting a hard error may cause a significant amount of work to be lost, potentially costing the user a significant amount of time and money. One alternative is to add redundant rows or columns to correct hard errors, but this approach may consume a large amount of area on the processing device. Another alternative is to replace a faulty sub-block by mapping it to another sub-block in the SRAM. However, setting aside portions of the SRAM to replace faulty sub-blocks may degrade the performance of the SRAM, e.g., by reducing the amount of memory available in the SRAM.

Furthermore, conventional approaches do not distinguish between activated and deactivated errors. An activated error is an error that can have a functional, power, or performance impact on the processing device. If an activated error is not detected, it can cause functional damage to the processes being performed by the processing device. A de-activated error is an error that may not have a significant functional, power, or performance impact on the processing device. For example, errors in predictor structures may be classified as de-activated errors because the undetected single bit errors may decrease the accuracy of the prediction but are unlikely to cause a functional impact on the corresponding process. Conventional replacement techniques assume that all detected errors are permanent activated errors and consequently do not allow for reuse or de-allocation of the resources reserved for replacement of faulty portions of the SRAM. For example, a faulty row or column is typically replaced with a redundant row or column by blowing an appropriate set of fuses so that the replacement cannot be undone.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
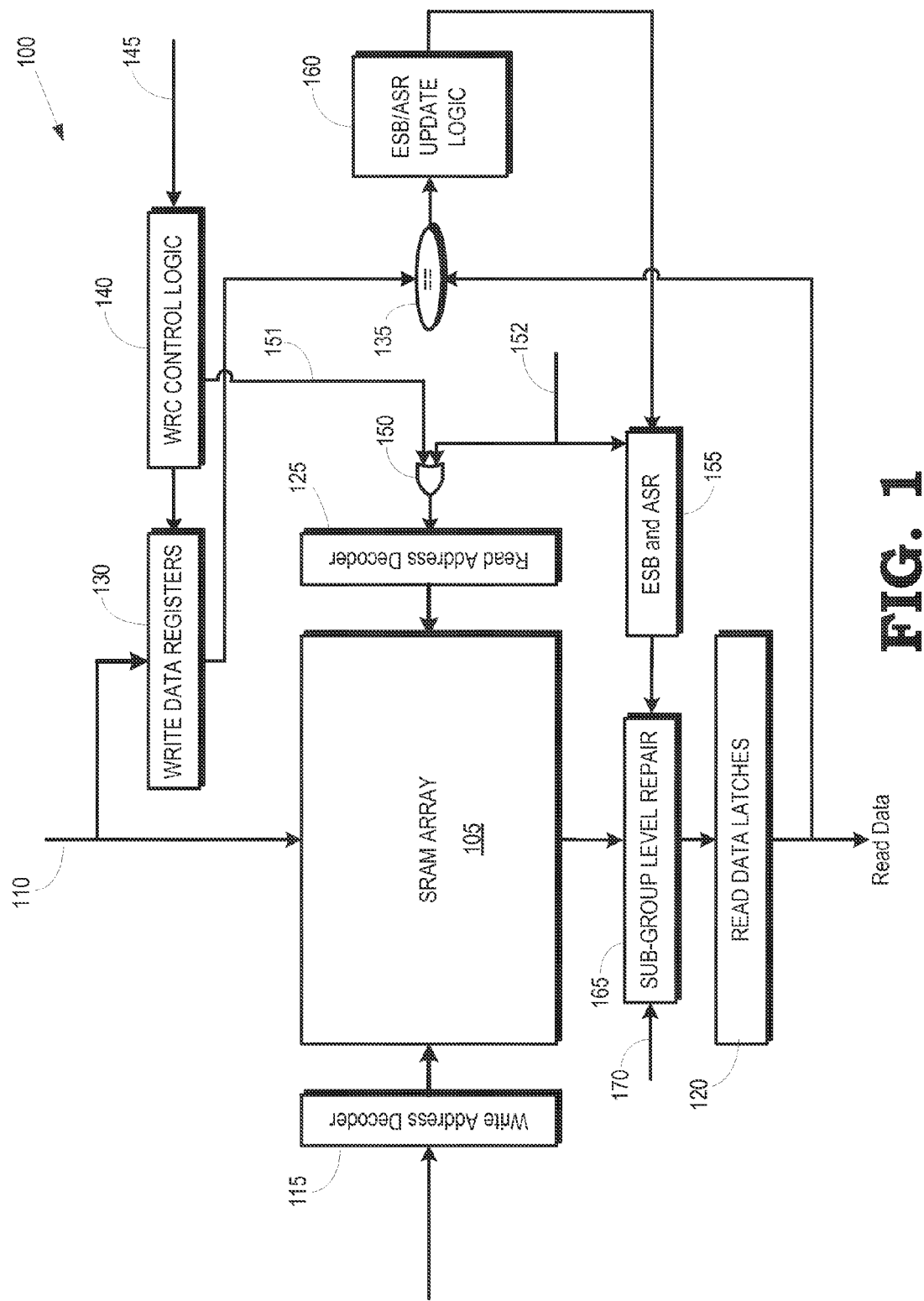
FIG. 1 is a block diagram of an integrated circuit that includes a memory array and circuitry for correcting hard errors in the memory array according to some embodiments.

FIGS. 1-9 describe embodiments of a processing device that can implement run time detection and classification of hard errors in portions of a memory, such as an SRAM array. The hard errors may then be corrected by replacing the faulty portions with reusable entries in an error status buffer. In the event that the hard errors are deactivated or otherwise resolved (e.g., by an increase in the operating voltage of the memory), the reusable entry can be deallocated and subsequently used to correct other hard errors in other portions of the memory. Reusing entries to correct hard errors detected at runtime, which may later resolve, can increase the number of hard errors that may be corrected over the lifetime of the processing device, potentially increasing production yield as well as the operational lifetime of processing devices such as a system-on-a chip (SOC).

Some embodiments of the processing device initially detect errors using conventional error detection techniques such as parity bits or error correcting code (ECC) bits. These conventional error detection techniques cannot distinguish between hard errors and soft errors. The portions of the memory that produce the errors may therefore be characterized as "eligible" portions that may include soft errors that can be corrected by rewriting or they may include hard errors that may be corrected using the hard error correction techniques described herein. Entries in an error status buffer may be allocated to the eligible portions. As discussed herein, the processing device then assumes the error is a soft error and attempts to correct the detected error by rewriting correct data to the eligible portion. Hard errors are not corrected by rewriting and may therefore be detected based on the rewritten data using write-read-compare logic that reads data out of the eligible portion and compares the data from the SRAM to a copy of the correct original data that has been stored in a buffer. During the write-read-compare flow, external read and write accesses to the SRAM array may be blocked. If the SRAM and buffered copies match, the error was a soft error that has been corrected by re-writing and the entry in the error status buffer can be deallocated. However, if the buffered copy does not match the SRAM copy, the write-read-compare logic indicates that a hard error has occurred and writes the correct data from the buffer to the entry of the error status buffer, which may store information corresponding to a subset of a row in the memory array that includes the hard error.

Subsequent read accesses to SRAM entries that include the faulty portion of the SRAM array receive data from the entry of the error status buffer instead of the location of the faulty portion in the SRAM, e.g., by multiplexing the data read from the error status buffer into data read from the SRAM entry. Subsequent write accesses to the faulty portion of the SRAM are stored in the error status buffer. The write-read-compare (WRC) logic may subsequently reevaluate the error status of faulty portions of the SRAM and may deallocate entries in the error status buffer in the event that the faulty portions are deactivated or otherwise resume correct operation.

FIG. 1 is a block diagram of an integrated circuit 100 that includes memory and circuitry for correcting hard errors in the memory according to some embodiments. The memory includes an SRAM array 105 that can store data that is written to the array via the input 110. A write request includes an address that indicates the location of the memory elements, e.g., the row and column address of a set of bits to be stored, and the address can be decoded using a write address decoder 115. The data can then be stored at the location in the SRAM 105 indicated by the address. Data can be read out of the SRAM array 105 and into read data latches 120. Read requests include an address that indicates the location of the memory elements, e.g., the row and column address of a set of bits to be read, and the address can be decoded using a read address decoder 125. As discussed herein, soft errors or hard errors may be detected when data is read from the SRAM 105. The integrated circuit 100 may therefore include circuitry that determines whether a detected error is a soft error or a hard error and then takes appropriate action based on the type of error. Some embodiments of the error detection or correction circuitry may be integrated with the SRAM array 105 or may be implemented outside of the SRAM array 105, e.g., if the circuitry is shared between multiple memory arrays.

Some embodiments of the error detection and correction circuitry include one or more write data registers 130. Data that is written to the SRAM array 105 may also be written to the write data registers 130. The data written to the SRAM array 105 may subsequently be read from the SRAM array 105 and compared to the data in the write data registers 130 using a comparator 135. Some embodiments of the write data registers 130, the comparator 135, and the associated data path may be implemented by re-purposing memory built-in self test (MBIST) logic or circuitry. The write data registers 130 may be implemented using error tolerant flip-flops. Write-read-compare (WRC) control logic 140 may be used to trigger a WRC flow to perform the comparison in response to assertion of a fault trigger 145 that may be used to trigger the WRC flow. Some embodiments may assert the fault trigger 145 in response to each write to the SRAM array 105 or in response to other trigger conditions being satisfied, as discussed herein.

Some embodiments of the fault trigger 145 may be asserted in response to a parity error or ECC error detected in a previous operation on the SRAM array 105. For example, in response to a parity error or ECC error being detected, the faulty SRAM cell(s) may be rewritten to attempt to correct a soft error. The WRC control logic 140 may then cause the write data registers 130 to capture the rewritten data on the input lines 110 in parallel with rewriting the data to the SRAM array 105. Some embodiments of the WRC control logic 140 may determine which portion of the SRAM array 105 produced the error, such as a row of the SRAM array 105 or a sub-group of cells within the row.

After the data has been rewritten to the SRAM array 105 and captured by the write data registers 130, the WRC control logic 140 may provide a read enable or trigger signal to read the rewritten data from the SRAM array 105 and provide this data to the comparator 135. During the WRC flow, external read and write accesses to the SRAM array are blocked. An OR gate 150 or other logic may be used to enable the read address decoder 125 for decoding an address in a read request. Some embodiments of the OR gate 150 receive read enable signals 151, 152 from the WRC control logic 140 and conventional read request logic (not shown), respectively. During WRC flow, sub-group level repair logic 165 is disabled (by signal 170) to prevent hard errors from being masked off by the sub-group level repair logic. Since the data that is read from the SRAM array 105 in response to the signal from the WRC control logic 140 is read from the same location that was previously identified as producing an error, the results of the comparison indicate whether this error is a soft error or a hard error. If the data read from the SRAM array 105 is the same as the data read from the write data registers 130, rewriting data to the SRAM array 105 fixed the previous error, which was therefore a soft error. If the data read from the SRAM array 105 differs from the data read from the write data registers 130, rewriting data to the SRAM array 105 did not fix the previous error, which is therefore a hard error.

Hard errors may be corrected using information stored in an error status buffer (ESB) and array status register (ASR) 155. Some embodiments of the integrated circuit 100 may therefore include ESB/ASR update logic 160 that can be used to update the ESB and ASR 155 in response to signals from the comparator 135 indicating the detection of a hard error. Some embodiments of the ESB/ASR update logic 160 may be used to write portions of the data from the write data registers 130 in to an ESB entry in the ESB and ASR 155 that has been allocated to correct the hard error. The ESB/ASR update logic 160 may also update an error status field and fields identifying the location of the hard error in the ESB entry. The ASR may be used to store a flag that indicates whether at least one eligible error has been detected in the SRAM array 105 and a counter that indicates the number of ESB entries that have been allocated.

Sub-group level repair logic 165 may be used to repair hard errors by multiplexing data stored in the ESB entries into data read from the SRAM array 105. For example, if the SRAM array 105 receives a read request for a location in a row that includes a hard error, the row may be read out of the SRAM array 105 and into the sub-group level repair logic 165. Correct data for a subset of the row that includes the hard error may have been previously stored in an ESB entry and this subset of the data can be provided to the sub-group level repair logic 165 by the ESB and ASR 155. The sub-group level repair logic 165 may then replace the subset of the row read from the SRAM array 105 (which includes the hard error) with the correct data for the subset of the row that was stored in the ESB entry. The corrected row of data may then be provided to the read data latches 120. Some embodiments of the sub-group level repair logic 165 may receive a signal 170 from the WRC control logic 140 to disable the sub-group level repair logic 165 concurrently with performing the WRC comparison. This may prevent hard errors from being masked by the sub-group level repair logic 165.

Figure 2:
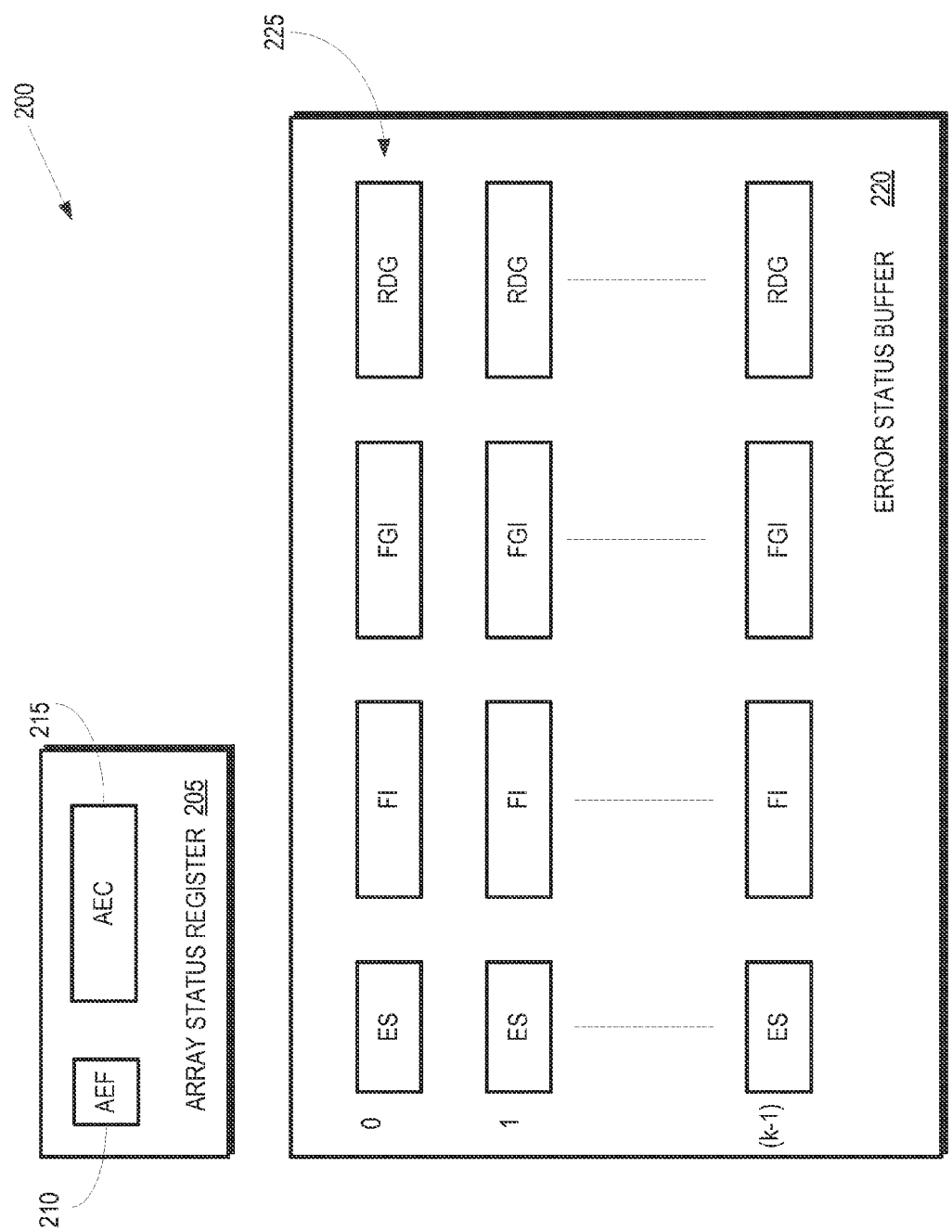
FIG. 2 is a block diagram of an error status buffer (ESB)/ array status register (ASR) according to some embodiments.

FIG. 2 is a block diagram of an ESB/ASR 200, such as the ESB/ASR 155 shown in FIG. 1, according to some embodiments. The ESB/ASR 200 includes an array status register 205 that holds an array error flag (AEF) 210 and an array error counter (AEC) 215. The ESB/ASR 200 also includes an error status buffer 220 that holds a plurality of entries 225 (numbered 0 to k−1) for allocation to the eligible errors, such as the hard errors that may be detected by the WRC logic shown in FIG. 1. The number (k) of ESB entries 225 is a matter of design choice and may be selected based on the number of word lines in the memory array that are to be protected.

Each entry 225 includes fields for an error status (ES), a fault index (FI) that includes information indicating the row, word line, or other portion of the memory array that includes the error, a fault group index (FGI) that indicates a sub-group or subset of the portion of the memory indicated by the fault index that includes the error, and a redundant data group (RDG) field to store correct data for the subset that includes the error. The ES may be set to 00 to indicate an invalid or unused entry, 01 to indicate that a soft or hard error has been detected, 10 to indicate that a hard error has been detected, or 11 if the entry is error free. If the memory array has n rows (or word lines) and m columns (or bitlines), then the FI is $\log 2(n)$ bits wide. If the subsets (or sub-groups) of the rows are each M bits wide, then the FGI is $\log 2(m/M)$ bits wide and RDG is M bits wide. The value of M should be set equal to or larger than the minimum data size covered by parity bits or ECC. Some embodiments may not include error protection for the RDG bits because these may be protected by existing soft error protection mechanisms for the memory array. Some embodiments may include an additional parity bit for each ESB entry 225 to provide parity protection for the ES, FI, and FGI bits. Some embodiments may also use error tolerant flip-flops to store the ES, FI, and FGI bits.

The AEF 210 can be reset or initialized to 0 and may be set to 1 if there is at least one eligible error. Some embodiments of the AEF 210 may be used to trigger the use of the error status buffer 220 for error correction of a memory array such as the SRAM array 105 shown in FIG. 1. The AEC 215 includes $\log 2(k)$ bits and may be reset or initialized to 0. The AEC 215 can be incremented each time an eligible error is detected in a row of a memory array such as the SRAM array 105 shown in FIG. 1. The AEC 215 may be decremented each time a valid ESB entry which was previously allocated is recovered. The recovery is done if the WRC flow on a write to a previously found faulty region (sub-group) in the SRAM array finds that the fault is no longer present in the sub-group of the accessed entry. The AEC 215 may therefore count the number of active entries in the error status buffer 220. The error status buffer 220 may not provide any additional protection once all of the entries 225 are used to protect other portions of the memory array. This condition may be indicated by the AEC 215 reaching its maximum value and may be used to indicate that other logic such as machine check architecture (MCA) logic should be notified by providing an appropriate signal.

Figure 3:
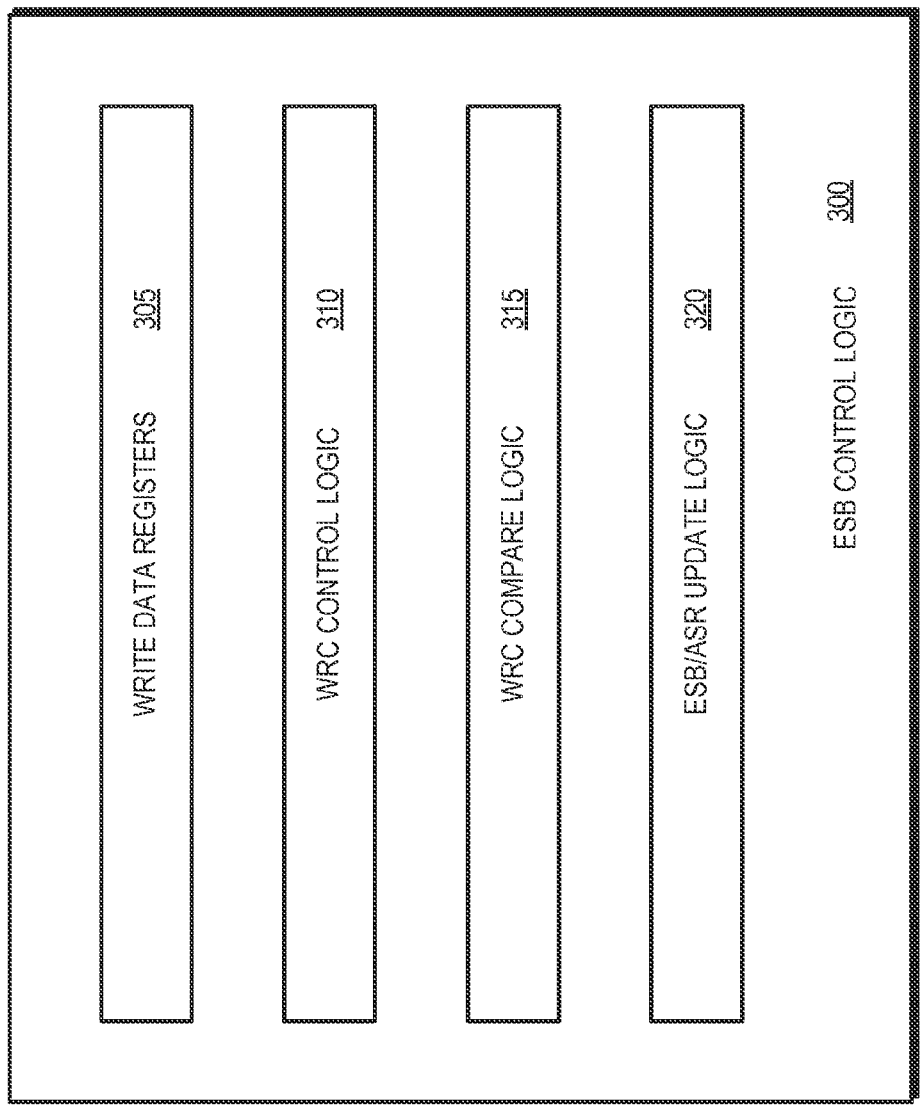
FIG. 3 is a block diagram of ESB control logic that may be used to perform hard error detection or correction in the integrated circuit shown in FIG. 1 according to some embodiments.

FIG. 3 is a block diagram of ESB control logic 300 that may be used to perform hard error detection or correction in the integrated circuit 100 shown in FIG. 1 according to some embodiments. The ESB control logic 300 includes write data registers 305 such as the write data registers 130 shown in FIG. 1, WRC control logic 310 such as the WRC control logic 140 shown in FIG. 1, WRC compare logic 315 such as the comparator 135 shown in FIG. 1, and ESB/ASR update logic 320 such as the ESB/ASR update logic 160 shown in FIG. 1.

The ESB control logic 300 may be integrated with a memory array such as the SRAM array 105 shown in FIG. 1 or the ESB control logic 300 may be implemented as a discrete entity separate from any particular memory array. For example, the ESB control logic 300 may implemented as a separate entity and may then be used to perform hard error detection and/or correction for multiple memory arrays.

Figure 4:
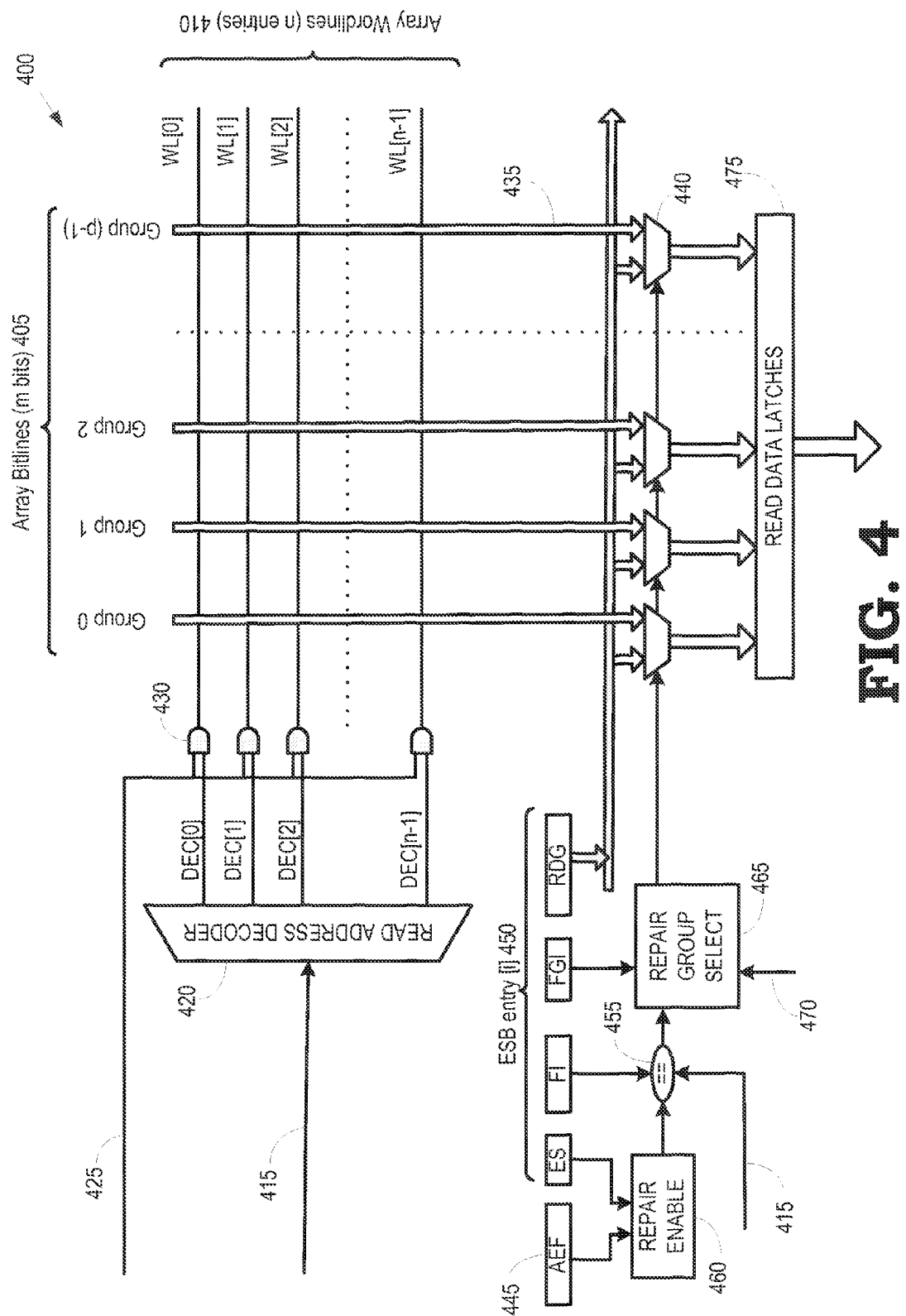
FIG. 4 is a block diagram of sub-group level repair logic of the integrated circuit shown in FIG. 1 according to some embodiments.

FIG. 4 is a block diagram of repair logic 400 such as the sub-group level repair logic 165 shown in FIG. 1 according to some embodiments. The repair logic 400 is used to repair hard errors in portions of a memory array that can be addressed by n word lines (or rows) 410 and m bit lines (or columns) 405. The bit lines 405 are divided into p groups or subsets. Data stored in the memory array can be read by providing a read index 415 to a read address decoder 420. Decoded signals from the read address decoder 420 may be asserted to the word lines 410 in conjunction with a read enable signal 425 supplied to corresponding AND gates 430 (only one indicated by a reference numeral in the interest of clarity). A row of data may then be read out of the memory array. Some embodiments may read the row of data in groups (0 to p−1), as indicated by the arrows 435 (only one indicated by a reference numeral in the interest of clarity). The groups of data may then be provided to corresponding multiplexers 440 (only one indicated by a reference numeral in the interest of clarity).

The repair logic 400 may also use an AEF 445 and information from ESB entries 450 to repair the faulty sub-group in the row of data that is read from the memory array. The read index 415 is provided to a comparator 455 in the repair logic 400, which can compare the read index 415 to the fault indices of the ESB entries 450. The repair logic 400 repairs the faulty sub-group in the row of data if the read index 415 hits a fault index of one of the ESB entries 450. Repair enable logic 460 receives the AEF 445 and an error status (ES) for the ESB entry 450 that corresponds to the read index 415. If the AEF 445 indicates that there is at least one eligible entry in the error status buffer and the error status indicates that the ESB entry is for a hard error, the repair enable logic 460 provides an enable signal to a repair group select logic 465, e.g., via the comparator 455.

In response to the enable signal from the repair enable logic 460, the repair group select logic 465 accesses the information in the FGI field to generate selection signals for the multiplexers 440. For example, if the FGI field has a value of 0, indicating that the hard error is in Group 0, the repair group select logic 465 provides a selection signal to the first (leftmost in FIG. 4) multiplexer to select data from the RDG field of the selected ESB 450 instead of the data read from Group 0 of the row. The repair group select logic 465 also provides selection signals to the remaining multiplexers to select data provided by the memory array, e.g., the data read from Groups 1 to p−1 of the row. The repaired row of data may then be provided to read data latches 475. Some embodiments of the repair group select logic 465 may be disabled using a disable signal 470, e.g., to prevent the repair logic 400 from masking hard errors during a WRC comparison, as discussed herein.

Figure 5:
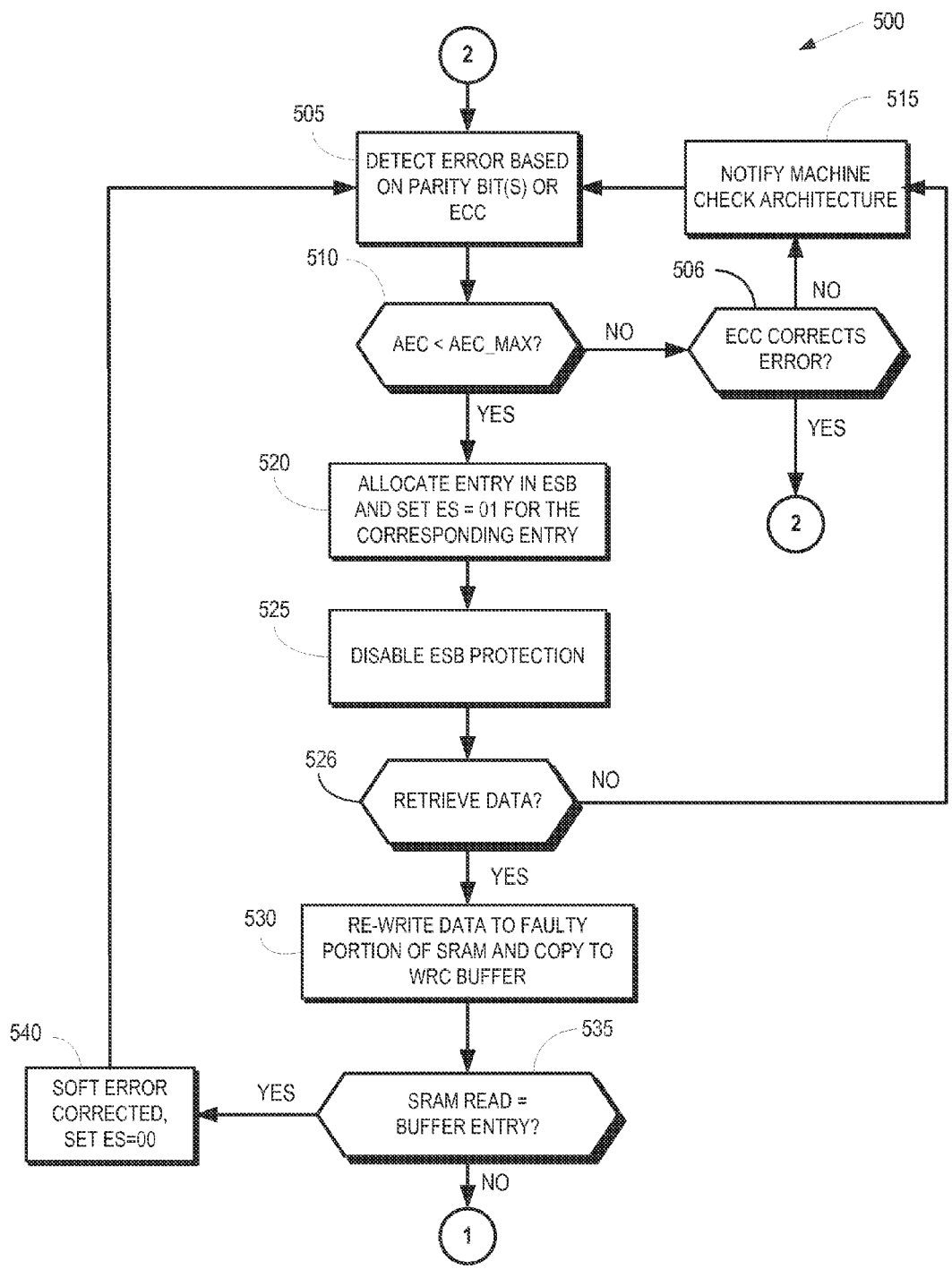
FIG. 5 is a flow diagram of a method for classifying and repairing errors according to some embodiments.

FIG. 5 is a flow diagram of a method 500 for classifying and repairing errors according to some embodiments. Some embodiments of the method 500 may be implemented in control logic such as the WRC control logic 140 shown in FIG. 1 or ESB control logic 300 shown in FIG. 3. Data may be read from a memory array such as the SRAM array 105 shown in FIG. 1 and, if an array error flag indicates that there is at least one entry in the error status buffer, data may also be read in parallel from the error status buffer. At block 505, the control logic detects an error in the data read from the memory array and/or error status buffer based on parity bits or ECC information. The error may be a soft error that can be corrected by rewriting the data or a hard error that persists even after rewriting the data. At decision block 510, the control logic checks whether the array error count is less than its maximum value, indicating that less than all of the entries in the error status buffer have been allocated. If not, and all of the entries have been allocated, then the control logic checks whether the ECC can correct the detected error (at decision block 506). If so, then the control logic proceeds to block 505 and continues to monitor for other errors. If not, the control logic notifies MCA logic to take appropriate action at block 515 and then continues to monitor for other errors.

At block 520, the control logic allocates a new entry in the error status buffer if the array error count indicates availability of one or more ESB entries. The control logic may also set the error status (ES) to indicate that the error may be a hard error or a soft error, e.g., by setting the ES field to 01. Some embodiments of the control logic may also disable ESB protection at block 525 so that data provided by the ESB protection logic does not interfere with the subsequent write-read-compare (WRC) flow. At block 526, a correct copy of the data that was stored in the SRAM array is retrieved. If the copy cannot be retrieved, the control logic notifies the MCA at block 515. If the correct copy can be retrieved, then data is rewritten (at block 530) to the faulty portion of the SRAM array that produced the errors to restore the correct value. A copy of the data is also written to a WRC buffer or register, e.g. the write data registers 130 shown in FIG. 1 or the write data registers 305 shown in FIG. 3. Some embodiments of SRAM arrays are protected by ECC. In these embodiments, the ECC can provide the corrected data for the WRC flow if the ECC can successfully correct the data.

The rewritten data stored in the WRC register is compared to the rewritten data that is read from the SRAM array at decision block 535. If the two copies are the same, the error is classified (at block 540) as a soft error that has been corrected by rewriting the data. The control logic may therefore set the error status to invalidate or deallocate the entry in the ESB, e.g., by setting ES=00. The control logic may then continue to monitor data to detect errors at block 505. If the two copies differ from each other, the method 500 may continue with repair as indicated in FIG. 6.

Figure 6:
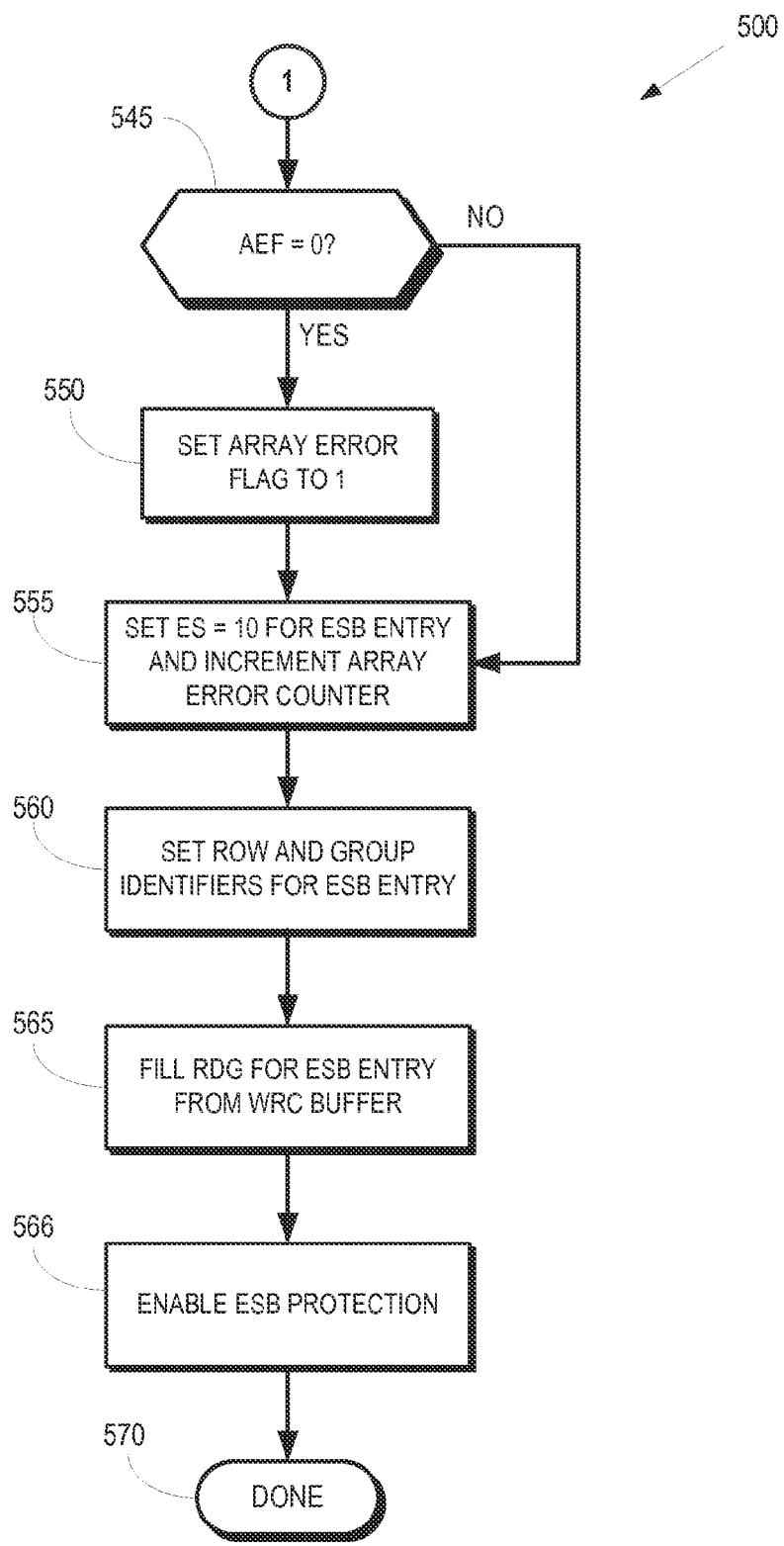
FIG. 6 is a flow diagram of additional portions of the method shown in FIG. 5 for classifying and correcting errors according to some embodiments.

FIG. 6 is a flow diagram of additional portions of the method 500 for classifying and correcting errors according to some embodiments. In response to the two copies of the rewritten data differing from each other, the control logic determines at decision block 545 whether the array error flag (such as the AEF 205 shown in FIG. 2) is equal to zero, indicating that no entries in the ESB have been allocated. If so, the control logic sets the array error flag to 1 at block 550 to indicate that an entry in the ESB has been allocated to the current error. The control logic then sets the error status at block 555 to indicate that the error is a persistent or permanent hard error, e.g., by setting ES=10. The control logic also increments the array error counter. At block 560, the control logic determines the row that includes the error and, in some embodiments, also determines the subset of the row that includes the error. The row and group identifiers can then be stored in the ESB entry. For example, the row and group identifiers may be the fault index and fault group index described herein. At block 565, the control logic fills the redundant data group (RDG) field using the correct data that is stored in the WRC register. In some embodiments, the control logic enables ESB protection in block 566 so that subsequent accesses to faulty rows in the SRAM array can be corrected via the use of ESB. The method 500 then completes at block 570.

Figure 7:
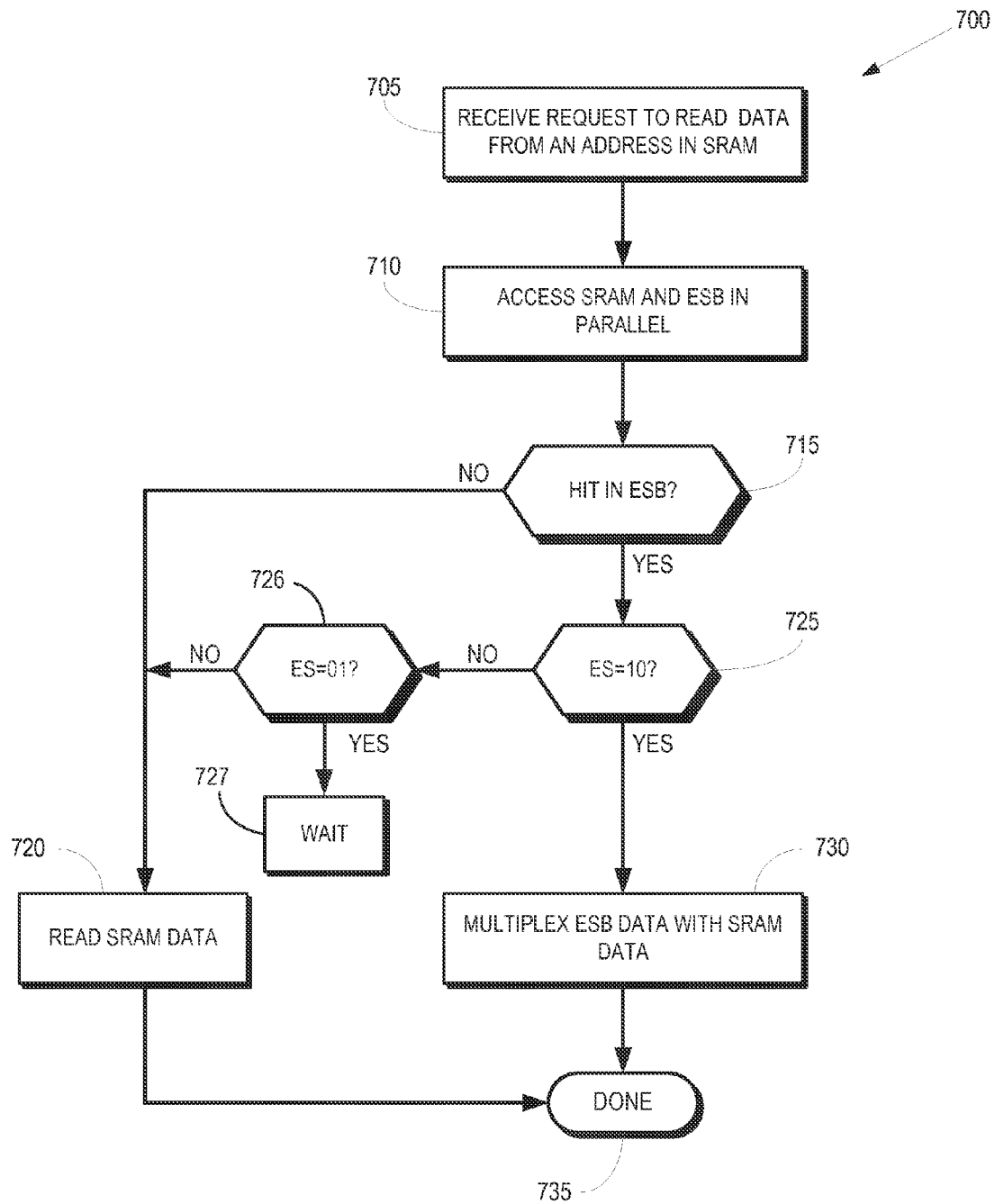
FIG. 7 is a flow diagram of a method for correcting hard errors according to some embodiments.

FIG. 7 is a flow diagram of a method 700 for correcting hard errors according to some embodiments. The method 700 may be implemented in repair logic such as the sub-group repair logic 165 shown in FIG. 1 or the sub-group repair logic 400 shown in FIG. 2. Some embodiments of the method 700 may be used when the repair logic has not detected a parity or ECC error. The method 700 may begin at block 705 when a memory array such as the SRAM array 105 shown in FIG. 1 receives a request to read data from an address in the memory array. At block 710, the address in the read request is used to access the SRAM array and the ESB in parallel. At decision block 715, the repair logic determines whether the address in the read request hits an entry in the ESB. If not, the data is read from the SRAM array at block 720 and provided to the read data latches, as discussed herein. If the address in the read request hits an entry in the ESB, the control logic then accesses the error status to determine whether the error is a hard error at decision block 725. For example, an ES value of ES=10 indicates that the error is a hard error. If the error is a hard error, data from the ESB entry is multiplexed into data read from the SRAM array and provided to the read data latches at block 730, as discussed herein. The method 700 then completes at block 735.

At decision block 726, the control logic determines whether the error status indicates that the error may be either a soft or hard error. For example, an ES value of ES=01 indicates that the error is either a soft error or a hard error, but a value of ES=01 does not indicate whether the error is soft or hard. If the control logic determines that the error is either soft or hard then the control logic blocks (at block 727) the read request until the correct copy of the data is retrieved. For example, a hit on an ESB entry that has an ES value of ES=01 also indicates that there is another request pending on the same faulty row of the SRAM array. The current read request is therefore blocked until the previous read request completes so that the value of ES changes to 00 or 10 depending on the type of error. If the control logic determines (at decision block 726) that there is no error (ES=00) or error-free (ES=11) then the data is read from the SRAM array at block 720 and provided to the read data latches, as discussed herein.

Figure 8:
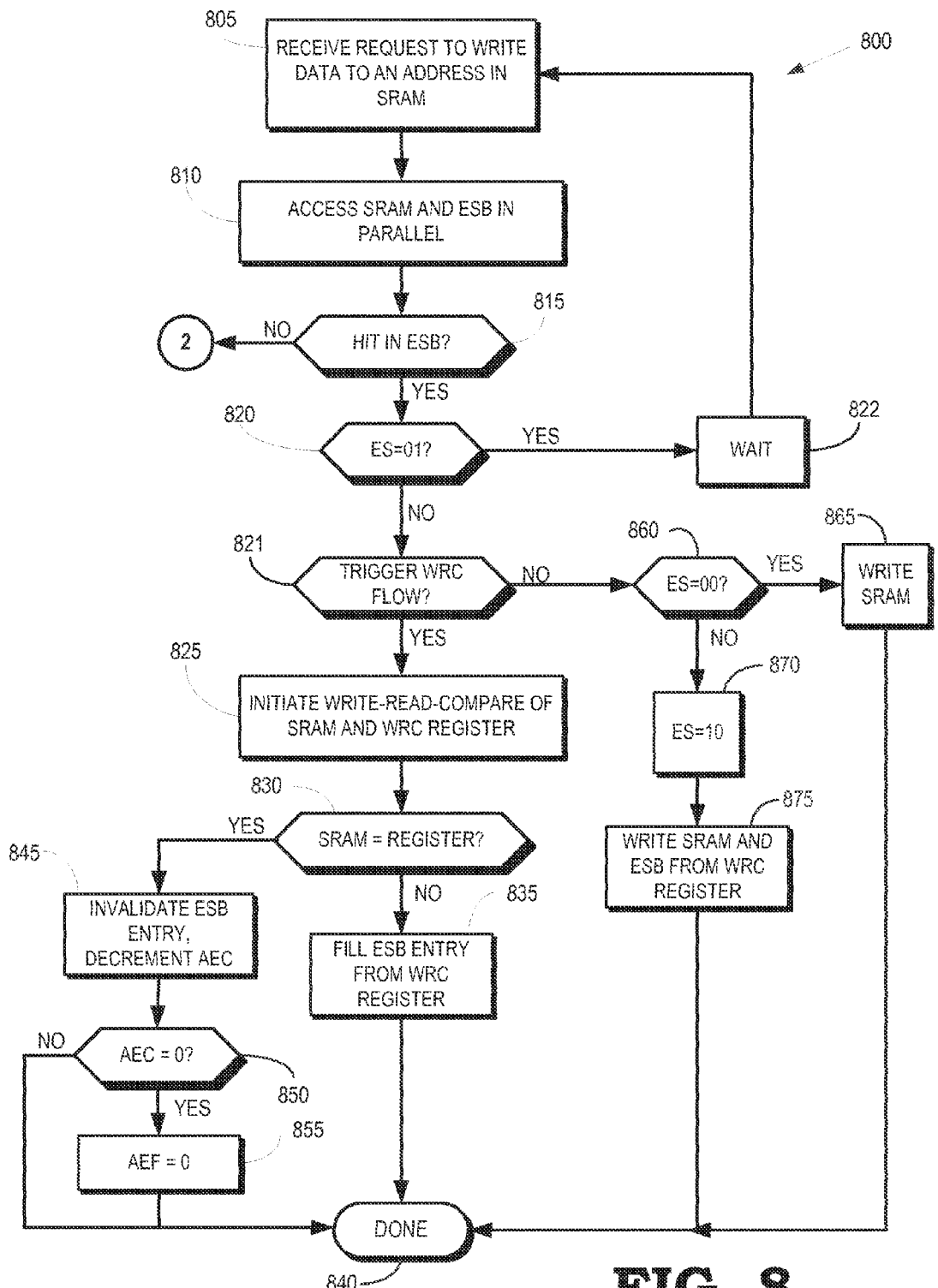
FIG. 8 is a flow diagram of a method for writing data to a memory array according to some embodiments.

FIG. 8 is a flow diagram of a method 800 for writing data to a memory array according to some embodiments. The method 800 may be implemented in update logic such as the ESB/ASR update logic 160 shown in FIG. 1. Some embodiments of the method 800 may be used when the update logic has not detected a parity or ECC error. The method 800 may begin at block 805 when a memory array such as the SRAM array 105 shown in FIG. 1 receives a request to write data to an address in the SRAM array. The SRAM array and the ESB may then be accessed in parallel at block 810. For example, the data may be written to the address in the SRAM array and to a WRC register such as the WRC register 130 shown in FIG. 1. At decision block 815, the update logic may then determine whether the address hit an entry in the ESB. If not, the method 800 may proceed as discussed below with regard to FIG. 9.

If the address hit an entry in the ESB at decision block 815, the update logic determines (at decision block 820) whether the error status indicates that the error is a "soft or hard" error (e.g., if ES=01). As discussed herein, a hit on an ESB entry that has an ES value of ES=01 may indicate that there is another request pending on the same faulty row of the SRAM array. Thus, if the update logic determines (at decision block 820) that the error is a "soft or hard" error (e.g., ES=01) then the request is blocked and the system waits (at block 822) until the correct data is retrieved and the previous request on the SRAM array's faulty entry completes. Once the previous request has completed, the method 800 restarts from block 805. If the update logic determines that the error is not a "soft-or-hard" error (e.g., ES is not equal to 01 at decision block 820) then it proceeds to decision block 821.

At decision block 821, the update logic decides whether to trigger a WRC flow. As discussed below, the WRC flow may be triggered under various combinations of trigger conditions to trade off the costs and benefits of the WRC algorithm. If the update logic decides to trigger a WRC flow at decision block 821, then it proceeds to block 825.

At block 825, the update logic initiates a write-read-compare flow to compare the data written to the SRAM array with the data written to the WRC register. If the data written to the SRAM array does not match the data written to the WRC register at decision block 830, indicating that the error is a hard error, the RDG field in the ESB entry may be filled with the correct data from the WRC register at block 835. The method 800 may then end at block 840. If the data written to the SRAM array matches the data written to the WRC register at decision block 830, indicating that the error has been corrected, deactivated, or otherwise resolved, the update logic invalidates the ESB entry at block 845. Since the ESB entry has been deallocated, the update logic may also decrement the array error counter. If the array error counter is decremented to zero at the decision block 850, the array error flag may also be set to zero at block 855 to indicate that there are no eligible errors in the SRAM array, if there are no eligible ESB entries after decrementing. The method 800 may then end at block 840.

If the update logic decides not to trigger a WRC flow at decision block 821, the update logic may determine (at decision block 860) whether the error status indicates that there was no error, e.g., ES=00. If this condition is true and no error occurred, data may be written to the SRAM at block 865. If the condition is false and an error has been detected, the value of the error status flag should indicate a hard error, e.g., the value of ES may be 10 at block 870. At block 875, data from the WRC register may be written to the SRAM and the ESB. The method 800 may then end at block 840.

Figure 9:
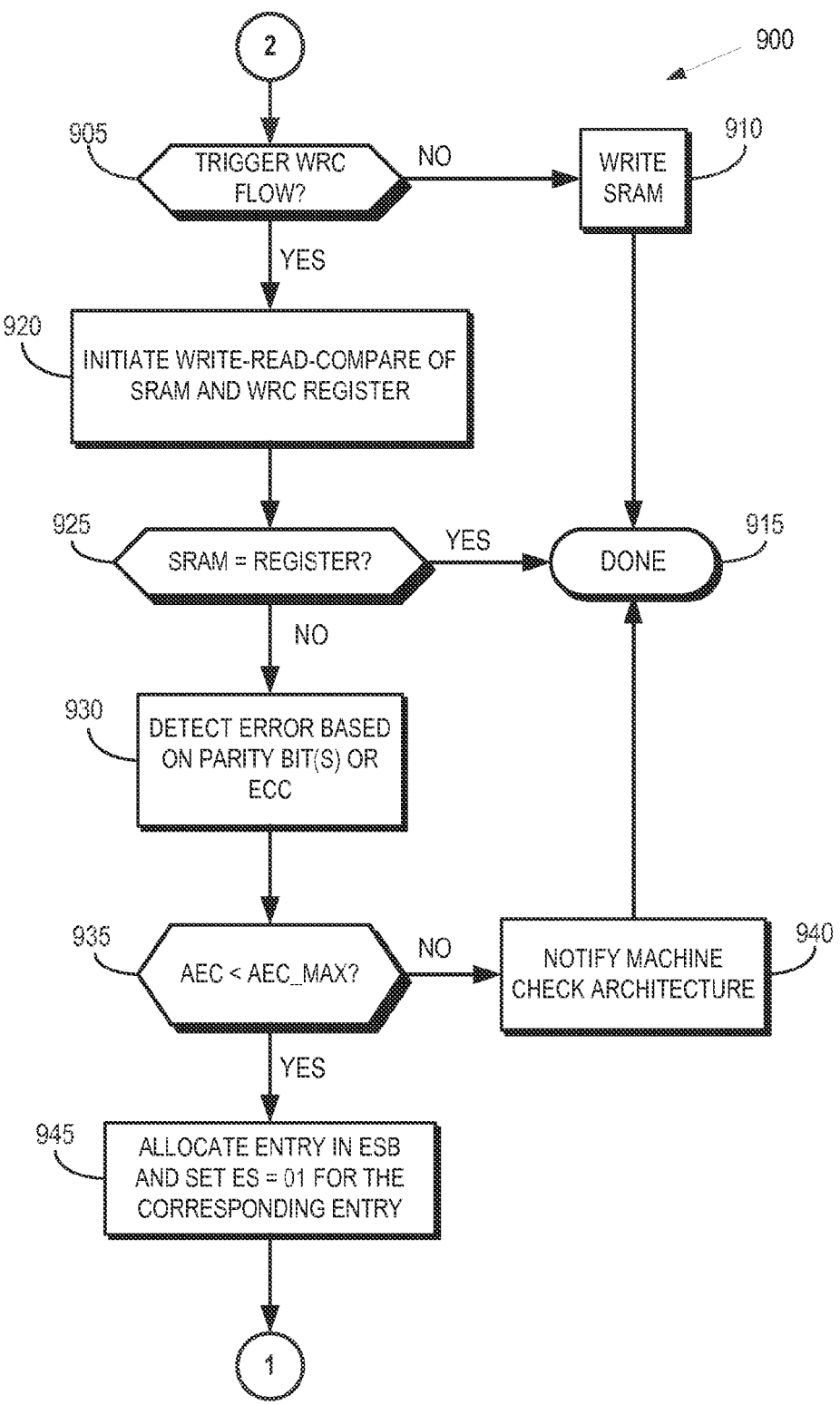
FIG. 9 is a flow diagram of additional portions of the method shown in FIG. 8 for writing data to a memory array according to some embodiments

FIG. 9 is a flow diagram of additional portions of the method 900 for writing data to a memory array according to some embodiments. The portion of the method 800 shown in FIG. 9 may be initiated when a hit is not detected in the ESB at decision block 815 in FIG. 8. For example, the portion of the method 800 shown in FIG. 9 may be initiated to attempt to detect errors that may have occurred, e.g., when the WRC flow is not triggered on every write error. Some embodiments of the WRC flow described herein can detect any number of activated, multi-bit errors in the same SRAM row (even those that parity/ECC cannot detect). At decision block 905, the update logic decides whether to trigger a WRC flow. As discussed below, the WRC flow may be triggered under various combinations of trigger conditions to trade off the costs and benefits of the WRC algorithm. If the update logic decides not to trigger a WRC flow at decision block 905, then data may be written to the SRAM at block 910 and the method 800 may end at block 915.

At block 920, the update logic initiates a WRC flow to compare the data written to the SRAM array with the data written to the WRC register. If the data written to the SRAM array matches the data written to the WRC register at decision block 925, the method 800 may end at block 915. If the data written to the SRAM array does not match the data written to the WRC register at decision block 925, indicating that an error may have occurred, the control logic may detect the error in the data read from the memory array and/or error status buffer based on parity bits or ECC information at block 930. At decision block 935, the control logic checks whether the array error count is less than its maximum value, indicating that less than all of the entries in the error status buffer have been allocated. If not, and all of the entries have been allocated, then the control logic notifies MCA logic to take appropriate action at block 940. The method 800 may end at block 915.

If the control logic determines (at decision block 935) that the array error count is less than its maximum value, the control logic allocates a new entry in the error status buffer at block 945. The control logic may set one or more error flags, fill some or all of the fields of the ESB entry corresponding to the error, or enable ESB protection, e.g., by proceeding to block 545 of the method 500 shown in FIG. 6.

Some embodiments of the error detection, classification, and correction techniques described herein may incur a dynamic power cost and may potentially lengthen write latency to the memory array. Some embodiments of the write-read-compare (WRC) algorithms described herein may therefore be invoked under various combinations of trigger conditions to trade off the costs and benefits of the WRC algorithm. For example, the WRC flow may be triggered on every write operation to the memory array. For another example, a wrap-around N-bit counter may be incremented each time the memory array is updated or accessed and the WRC flow may be triggered each time the counter wraps around so that the WRC flow is triggered periodically. For another example, the WRC flow may be triggered randomly or pseudo-randomly using a linear feedback shift register. For yet another example, the WRC flow may be triggered in response to a mode bit being set or enabled. Metrics may also be used to trigger the WRC flow. Exemplary metrics may include the total number of updates to word lines of the memory array (which may be monitored using a counter) or the number of misses or mispredictions or a sequence or pattern of misses or miss predictions experienced in the memory array, which may be useful if the memory array is used to implement a cache, a branch predictor, a translation lookaside buffer, a branch target buffer, etc. Different approaches may be selected to balance the power cost and memory latency against the expense of reduced error coverage and dynamic power savings resulting from firing the output latches and reductions in latency that may result because subsequent requests may not need to be blocked from accessing the memory array port.

Some embodiments may enable the WRC flow on every write operation even when no error has been detected by the parity check or ECC algorithm. In this case, embodiments of the WRC flow may provide improved error detection as well as improved error correction and classification.

In some embodiments, contents of the ESB and ASR may not be modified or discarded during context switches, performance-state transitions, or interrupts since these operations may track error information that is specific to the memory array. Contents of the ESB and/or ASR may also be maintained when the memory array operates in standby low power, retention mode or during a system-on-a-chip (SOC) reset operation. If an eligible error has been detected and logged in the ESB, SRAM word line (or row) information may be maintained across reset operations to prevent unnecessary implications of the MCA exception handler. For example, the word line information may be maintained using reset-persistent flip flops for the ESB fields such as ES, FI and FGI, as well as for the ASR. For another example, an MBIST may preload the ESB and ASR after detecting errors in the SRAM array during boot time. If a power domain that includes the memory array is power gated then the ESB fields (ES, FI and FGI) may be saved to memory and restored when the power domain is powered up again. Some embodiments may re-compute the ASR contents by microcode once the ESB contents are loaded from memory.

Some embodiments of the error classification and correction schemes described herein may have a number of advantages over the conventional practice by working in conjunction with parity checks or ECC algorithms to enhance multi-bit error protection beyond what a particular ECC is able to provide. For example, compared to maintaining full spare or redundant rows or columns, embodiments of the techniques described herein do not require fabrication of additional sets of redundant rows or columns, as well as allowing different numbers of ESB entries to be provided as spares for different numbers of subgroups depending on the memory array. The ESB entries may also be reused or deallocated in the event that an error is deactivated or otherwise resolved.

Embodiments of the techniques described herein also avoid performance degradation that may result from reserving such as cache lines portions of the memory array to replace the faulty portions. For another example, compared to scrubbing, the embodiments described herein can detect and correct hard faults, which cannot be done using scrubbing. Furthermore, embodiments of the techniques described herein do not consume bandwidth to read the memory array because they are engaged only when an error is detected, in contrast to the speculative use of scrubbing. For yet another example, compared to duplicating the entire memory array, embodiments of the techniques described herein are lower cost because they do not require duplicating the entire memory array.

Errors may also be classified without the use of a counter and they are only classified as permanent, i.e., a hard error, if the error changes the state of the consumer of the data. Thus, not all permanent errors need to be detected in order to repair the hard errors that could cause functional or performance changes. Entries in the ESB may therefore be reused or reallocated if one or more of the hard errors are deactivated.

In some embodiments, the apparatus and techniques described above are implemented in a system comprising one or more integrated circuit (IC) devices (also referred to as integrated circuit packages or microchips), such as the error classification and correction logic described above with reference to FIGS. 1-9. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or micro-electro-mechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 10:
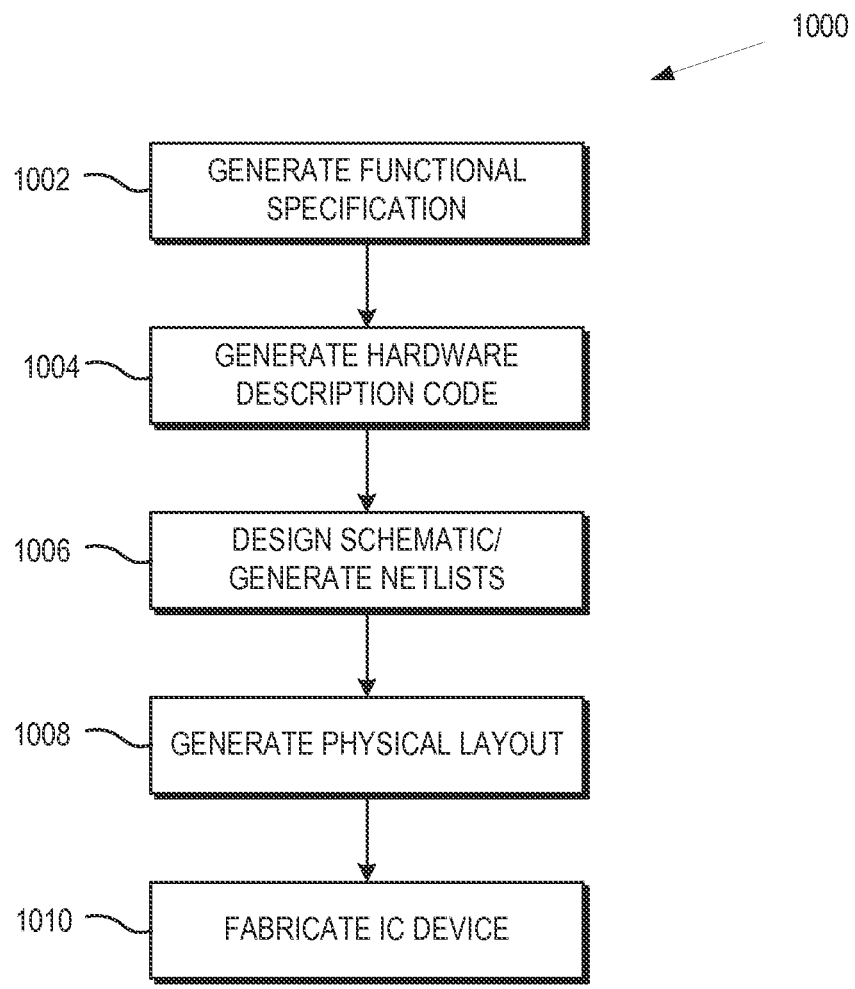
FIG. 10 is a flow diagram illustrating a method for designing and fabricating an integrated circuit device implementing at least a portion of a component of a processing system in accordance with some embodiments.

FIG. 10 is a flow diagram illustrating an example method 1000 for the design and fabrication of an IC device implementing one or more aspects in accordance with some embodiments. As noted above, the code generated for each of the following processes is stored or otherwise embodied in non-transitory computer readable storage media for access and use by the corresponding design tool or fabrication tool.

At block 1002 a functional specification for the IC device is generated. The functional specification (often referred to as a micro architecture specification (MAS)) may be represented by any of a variety of programming languages or modeling languages, including C, C++, SystemC, Simulink, or MATLAB.

At block 1004, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 1006 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, in some embodiments, the circuit is not synthesized from the hardware description code, instead a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 1008, one or more EDA tools use the netlists produced at block 1006 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 1010, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   rewriting data to a portion of a memory array and to a register in response to a first error in data read from the portion of the memory array;
   reading the rewritten data from the portion of the memory array and from the register; and
   writing the rewritten data from the register to an entry of an error status buffer in response to the rewritten data read from the register differing from the rewritten data read from the portion of the memory array.

2. The method of claim 1, further comprising:
   detecting the first error in the data read from the portion of the memory array using at least one of a parity bit or an error correcting code.

3. The method of claim 1, wherein each row of the memory array comprises a plurality of subsets of memory elements, the method further comprising:
   modifying an error status associated with the entry of the error status buffer to indicate that the error is a hard error that persisted after rewriting the data to the portion of the memory array; and
   storing a fault index that indicates a row of the memory array that includes the portion and a fault group index that indicates a subset of the row of the memory array that includes the portion.

4. The method of claim 3, wherein writing the rewritten data to the entry of the error status buffer comprises writing the rewritten data corresponding to the subset of the row of the memory array to the entry of the error status buffer.

5. The method of claim 4, further comprising:
   multiplexing data read from the entry of the error status buffer into data read from the row of the memory array using the fault group index as a selection signal for a plurality of multiplexers associated with the plurality of subsets of the row of the memory array.

6. The method of claim 5, further comprising:
   bypassing the multiplexing of data read from the entry of the error status buffer into data read from the row of the memory array concurrently with comparing the rewritten data read from the register to the rewritten data read from the portion of the memory array to determine whether the rewritten data read from the register differs from the rewritten data read from the portion of the memory array.

7. The method of claim 1, further comprising:
   restoring at least one of the error status buffer and an array status register following power gating of a power domain that includes the memory array using at least one of stored values and recomputed values of said at least one of the error status buffer and the array status register.

8. The method of claim 1, further comprising:
   writing new data to the memory and the register in response to an address of a write request hitting the entry in the error status buffer and then comparing the new data written to the memory with the corresponding new data written to the register; and
   filling the entry in the error status buffer with the new data written to the register in response to the new data written to the memory being different than the new data written to the register or invalidating the entry in the error status buffer in response to the new data written to the memory being the same as the new data written to the register.

9. The method of claim 1, further comprising:
   detecting at least one second error in data read from the portion of the memory array, rewriting data to the portion of the memory array and the register in response to detecting said at least one second error, and invalidating the entry of the error status buffer in response to data read from the portion of the memory array being the same as data read from the register.

10. An integrated circuit comprising:
    a memory array;
    a register;
    an error status buffer; and
    repair logic to rewrite data to a portion of the memory array and the register in response to a first error in data read from the portion of the memory array, and wherein the rewritten data is written from the register to an entry of the error status buffer in response to the rewritten data read from the register differing from the rewritten data read from the portion of the memory array.

11. The integrated circuit of claim 10, wherein the portion of the memory array is associated with at least one of a parity bit or an error correcting code, and wherein the first error in the data read from the portion of the memory array is detected using at least one of the parity bit or the error correcting code.

12. The integrated circuit of claim 10, wherein the entry of the error status buffer comprises information indicating an error status that indicates whether the error is a hard error, and wherein the memory array comprises a plurality of rows, and wherein each row of the plurality of rows comprises a plurality of subsets of memory elements, and wherein the entry in the error status buffer comprises a fault index that indicates a row of the memory array that includes the portion and a fault group index that indicates a subset of the row of the memory array that includes the portion.

13. The integrated circuit of claim 12, wherein the rewritten data corresponding to the subset of the row of the memory array is written to the entry of the error status buffer in response to the rewritten data read from the register differing from the rewritten data read from the portion of the memory array.

14. The integrated circuit of claim 13, further comprising:
    a plurality of multiplexers associated with the plurality of subsets of the row of the memory array, and wherein the multiplexes multiplex data read from the entry of the error status buffer into data read from the row of the memory array using the fault group index as a selection signal.

15. The integrated circuit of claim 14, further comprising:
    a comparator to compare the rewritten data read from the register to the rewritten data read from the portion of the memory array to determine whether the rewritten data read from the register differs from the rewritten data read from the portion of the memory array, and wherein multiplexing data read from the entry of the error status buffer into data read from the row of the memory array is bypassed concurrently with comparing the rewritten data read from the register to the rewritten data read from the portion of the memory array.

16. The integrated circuit of claim 10, wherein the repair logic is to restore at least one of the error status buffer and an array status register following power gating of a power domain that includes the memory array using at least one of stored values and recomputed values of said at least one of the error status buffer and the array status register.

17. The integrated circuit of claim 10, wherein data is rewritten to the portion of the memory array and the register in response to detecting at least one second error in data read from the portion of the memory array, and wherein the entry of the error status buffer is invalidated in response to data read from the portion of the memory array being the same as data read from the register.

18. A non-transitory computer readable medium embodying a set of executable instructions, the set of executable instructions to manipulate at least one processor to:
rewrite data to a portion of a memory array and to a register in response to a first error in data read from the portion of the memory array;
read the rewritten data from the portion of the memory array and from the register; and
write the rewritten data from the register to an entry of an error status buffer in response to the rewritten data read from the register differing from the rewritten data read from the portion of the memory array.

19. The non-transitory computer readable medium set forth in claim 18, comprising a set of executable instructions to manipulate said at least one processor to modify an error status associated with the entry of the error status buffer to indicate that the error is a hard error that persisted after rewriting the data to the portion of the memory array and store a fault index that indicates a row of the memory array that includes the portion and a fault group index that indicates a subset of the row of the memory array that includes the portion.

20. The non-transitory computer readable medium set forth in claim 18, comprising a set of executable instructions to manipulate said at least one processor to detect at least one second error in data read from the portion of the memory array, rewrite data to the portion of the memory array and the register in response to detecting said at least one second error, and invalidate the entry of the error status buffer in response to data read from the portion of the memory array being the same as data read from the register.

* * * * *